United States Patent
Arthur et al.

[11] Patent Number: 5,902,438
[45] Date of Patent: May 11, 1999

[54] PROCESS FOR THE FORMATION OF ANISOTROPIC CONDUCTING MATERIAL

[75] Inventors: Richard Arthur, Begbroke; Lyn Holt, Long Hanborough; David Baghurst, Cumnor, all of United Kingdom; Gary Lee Nicholls, Cranston, R.I.

[73] Assignee: Fry's Metals, Inc., Providence, R.I.

[21] Appl. No.: 08/910,280

[22] Filed: Aug. 13, 1997

[51] Int. Cl.⁶ .............................. B32B 31/18; H01R 1/00; H01B 1/20
[52] U.S. Cl. ......................... 156/247; 156/253; 156/289; 427/290; 439/66; 439/91
[58] Field of Search .................................... 156/247, 253, 156/289; 427/290; 439/66, 91

[56] References Cited

U.S. PATENT DOCUMENTS

| | | |
|---|---|---|
| 4,008,300 | 2/1977 | Ponn . |
| 4,020,206 | 4/1977 | Beil . |
| 5,041,183 | 8/1991 | Nakamura et al. ............... 439/66 X |
| 5,049,085 | 9/1991 | Reylek et al. ............... 439/91 |
| 5,136,359 | 8/1992 | Takayama et al. . |
| 5,188,702 | 2/1993 | Takayama et al. . |
| 5,216,807 | 6/1993 | Yoshizawa et al. ............... 439/66 X |
| 5,379,515 | 1/1995 | Kondo et al. ............... 439/66 X |
| 5,509,203 | 4/1996 | Yamashita ............... 439/91 X |
| 5,529,504 | 6/1996 | Greenstein et al. ............... 439/91 |
| 5,531,942 | 7/1996 | Gilleo et al. . |
| 5,624,268 | 4/1997 | Maeda et al. ............... 439/66 |
| 5,667,884 | 9/1997 | Bolger . |
| 5,681,647 | 10/1997 | Caillat . |
| 5,698,496 | 12/1997 | Fastnacht et al. . |
| 5,805,424 | 9/1998 | Purington ............... 439/66 X |
| 5,805,425 | 9/1998 | Peterson ............... 439/66 X |

FOREIGN PATENT DOCUMENTS

| | | |
|---|---|---|
| 0 645 950 | 3/1995 | European Pat. Off. . |
| 6-60930 | 3/1994 | Japan . |
| 6-139825 | 5/1994 | Japan . |
| 7-211373 | 8/1995 | Japan . |

OTHER PUBLICATIONS

Characterization of a Polymeric, Area Array, Z–Axis Interconnect Film Adhesive for Microelectronic Assembly, M. Corey et al., of Alpha Metals, Inc.; and D. Baghurst, et al., of Cookson Technology Centre.

*Primary Examiner*—Curtis Mayes
*Attorney, Agent, or Firm*—Mintz, Levin, Cohn, Ferris, Glovsky and Popeo, P. C.

[57] ABSTRACT

A process for the preparation of an anisotropic conducting material including the steps of providing a strip or sheet of a non-conducting matrix and laminating at least one layer of a release material to each side thereof to form a composite matrix, forming an array of holes in a predetermined pattern in the composite matrix, passing the matrix through a coating head which simultaneously fills the holes in the array in the composite matrix from both sides of the matrix with a conducting material, curing or drying the composite filled matrix and removing at least one layer of release material from each side of the matrix.

11 Claims, 1 Drawing Sheet

PROCESS FOR THE FORMATION OF ANISOTROPIC CONDUCTING MATERIAL

BACKGROUND OF THE INVENTION

The present invention relates to a process for the formation of composite films and, in particular, to a process for the formation of anisotropic electroconductive sheet materials for mechanically joining and electrically connecting electronic circuit components.

Anisotropic adhesive films are well known and have been used commercially in the electronics industry for some years. Anisotropic adhesive films generally comprise a sheet-like, dielectric, adhesive carrier material which is loaded with conductive particles. The particle loading is kept low so that the formation of electroconductive paths in the X- and Y-axis direction of the adhesive carrier material is avoided. The film is rendered conductive via the particles only in the Z-axis direction of the material.

Anisotropic adhesive films may be used in a variety of applications, such as the bonding of circuits and the bonding of components such as liquid crystals displays and surface mount devices. The most common anisotropic adhesive films are random in nature, i.e. the conductive particles are randomly distributed throughout the adhesive carrier material. The electrical interconnections are influenced by the number of point contacts per unit area and a high contact resistance and low current carrying capability can result.

PRIOR ART

The paper "Characterisation of a Polymeric, Area Array, Z-axis Interconnect Film Adhesive for Microelectronic Assembly", S. J. Corbett, K. Gilleo, M. Corey, D. Baghurst, G. Nicholls; Workshop on VLSI and Microsystem Packaging Techniques and Manufacturing Technologies, 6–7 May, 1996, Baveno, Italy, describes an interconnect adhesive in which isotropically conductive columns are accurately placed within a dielectric matrix polymer. The accurate placement of the conductive columns allows for the placement of the interconnect points only where they are needed. The resulting anisotropic conducting film adhesive has high electrical conductivity in the Z-axis direction and good electrical isolation in both the X- and Y-axis directions.

Processes for the preparation of ordered anisotropic adhesive sheets are described in U.S. Pat. No. 5,531,942 and include attaching electroconductive bodies at predetermined locations to the surface of a release material and forming the carrier about the discretely arranged bodies; or preforming the carrier and depositing and entrapping the bodies in the carrier at predetermined locations.

We have now developed an improved process for the preparation of ordered anisotropic electroconductive adhesive sheets.

SUMMARY OF THE INVENTION

A process for the preparation of an anisotropic conducting material, which process comprises the steps of:
(i) providing a strip or sheet of a non-conducting matrix and laminating to each side thereof at least one layer of a release material in order to form a composite matrix;
(ii) forming an array of holes in a predetermined pattern in the composite matrix from step (i);
(iii) passing the matrix from step (ii) through a coating head which simultaneously fills the holes of the array in the composite matrix from both sides of the said matrix with a conducting material;
(iv) curing or drying the composite filled matrix from step (iii); and
(v) removing at least one layer of release material from each side of the matrix.

DETAILED DESCRIPTION OF THE INVENTION

Figure 2:
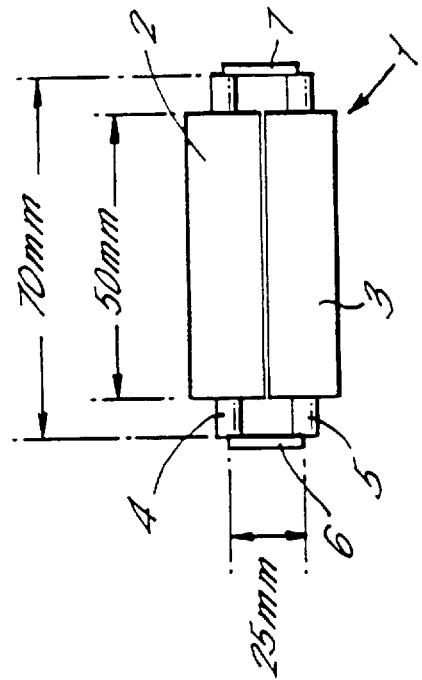
FIG. 2 is a schematic end view of the coating head of FIG. 1.

In the process of the present invention the non-conducting matrix generally comprises a dielectric adhesive carrier material, for example a thermoplastic or thermosetting polymer based adhesive. Thermoplastic polymer based adhesives generally have high mechanical strength, flexibility and the possibility of being reworked by heating. Examples of thermosetting polymer based adhesives which may be used in the present invention are epoxy resins, polyurethanes, silicones, phenolic resins and any other hydrocarbon based polymers that will form a three-dimensional cross-linked structure on "curing". Thermoplastic polymer based adhesives which may be used in the present invention are polyamides, polyurethanes, phenoxy resins, polyesters, polyacrylates, polysulphones, polysulfides halogenated hydrocarbons, polyamides, polyketones, polyvinyls, polystyrenes and any other hydrocarbon based polymers that will not cross-link during the application of heat.

The non-conducting matrix, in the form of a strip or sheet thereof, is laminated in step (i) of the process of the invention on each side thereof to at least one layer of a release material. Examples of release materials which may be laminated to the matrix are waxed or siliconised paper, PTFE or fluorocarbon based polymeric materials and any polymeric based tape which has a thermoplastic adhesive coating on one side thereof. The non-conducting matrix may be provided from a continuous roll, or as individual strips or sheets.

In a preferred aspect of the present invention a plurality of release layers is applied to at least one side of the non-conducting matrix. This enables a final product to be formed, after removal of the outer layers of release material from the composite matrix which has at least one side protected by the additional release layer. The product may then be wound up into a roll, or stacked as sheets for transportation and/or storage, with the additional release layer or layers then being removed from the product immediately before use.

The non-conducting matrix used in the present invention preferably has a thickness in the range of from 1 to 500 $\mu$m, more preferably from 50 to 150 $\mu$m.

In step (ii) of the process of the present invention the holes are formed in the composite matrix by punching or drilling the holes in a predetermined pattern. The holes may be in the range of from 5 $\mu$m to 3 mm in diameter. Furthermore, a plurality of holes of different diameters may be used in forming the pattern, if desired.

The composite matrix from step (ii) of the invention is then passed in step (iii) through a coating head which simultaneously fills the holes of the array from both sides of the composite matrix with a coating material. The coating head may comprise upper and lower pinch plates having a reservoir of a conducting material formed therebetween, the leading edges of the said pinch plates being separated by a distance sufficient to accommodate passage of the composite matrix between the said plates. During passage of the composite matrix through the coating head the conducting material is forced into the holes in the composite matrix from both sides thereof as the matrix passes through the coating head.

The pinch plates of the coating head may be curved or straight, as desired. Furthermore, the leading edge of the lower pinch plate may be offset from the leading edge of the upper pinch plate. Although it is preferred for the composite matrix to pass through the coating head in a manner such that the matrix travels in the same plane both before and after passage through the coating head, it is also possible for the matrix to be pulled out from the coating head at an angle, θ, to the plane in which it was originally travelling. In this manner, the position of the conducting columns in the non-conducting matrix may be controlled.

The conducting material may be, for example a conducting adhesive or a solder paste. Suitable conducting adhesives for use in the present invention include polymeric adhesives, such as those based on thermoplastic or thermosetting polymers loaded with particles or spheres of a conductive material such as silver. The base thermoplastic or thermosetting polymers which may be used are of the same type as the polymers used in forming the non-conducting matrix. Alternatively, the conducting material may be a solder paste, for example a solder paste containing particles or spheres of a solder alloy such as a Sn (63%) Pb (37%) eutectic or any alloys containing Sn, Pb, In, Ca, Cd, Ag, Au, Zn, Sb, in any range of compositions.

The process of the present invention has the specific advantages that since the holes in the non-conducting matrix are filled simultaneous from both sides of the matrix the conducting material filling the holes has the same composition throughout the conducting columns which are thereby formed. Furthermore, the process does not require the use of a vacuum or other technique in order to ensure that the conducting material is pulled down into the holes.

The present invention will be further described with reference to the accompanying figures, in which:

In a modification of the process of the present invention the composite matrix with an array of holes in a predetermined pattern may be preformed and passed to step (iii) of the process as defined above.

Figure 1:
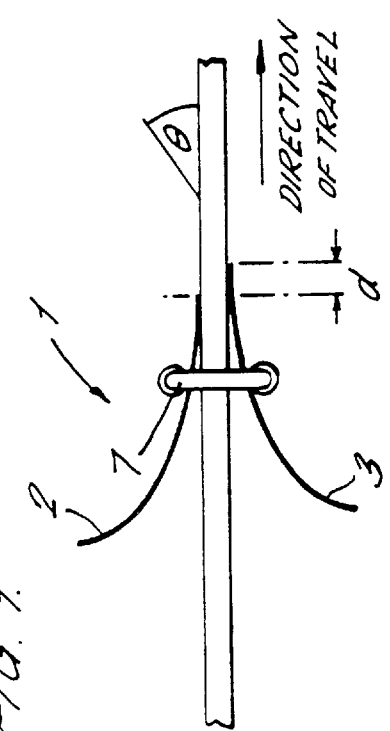
FIG. 1 is a schematic side view of an embodiment of a coating head used in the present invention.

Referring to the figures, a coating head for use in the process of the present invention is illustrated in FIGS. 1 and 2. The coating head 1 comprises two curved stainless steel pinch plates 2 and 3 both 50 mm wide which are mounted between two elongate rollers 4 and 5 both 70 mm in length which are spaced apart at either end by steel rods 6 and 7 which are each 25 mm long. The pinch plates 2 and 3 are curved in a manner such that the distance from the leading edge of the upper pinch plate 2 to the locating rollers is 35 mm. The leading edge of the lower pinch plate 3 may be offset from the leading edge of the upper pinch plate 2 by a distance, d, if desired.

Figure 3:
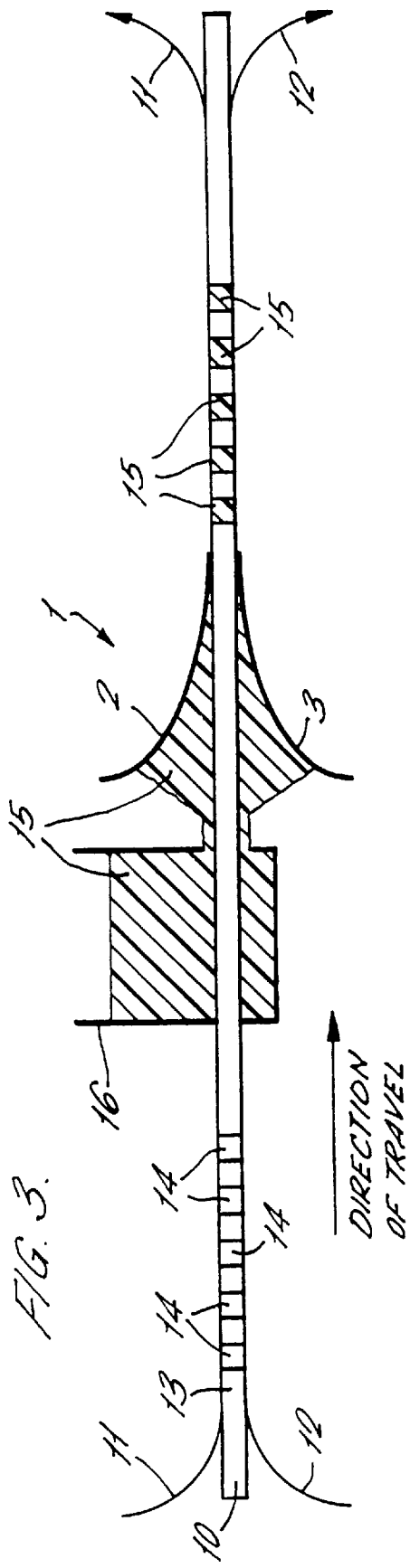
FIG. 3 is a schematic outline of the process of the present invention.

The process of the invention is shown schematically with reference to FIG. 3. An adhesive film 10, such as Staystik 482 (Alpha Metals Inc.), is laminated between two layers of a release material 11 and 12, for example a pressure sensitive polyvinyl chloride film such as that sold under the trade name Sellotape. The composite film 13 is then punched or drilled to form an array of holes 14 therein which extend through the composite film. The composite film 13 is then passed in the direction marked with the arrow through a coating head 1, as described above with reference to FIGS. 1 and 2. The area between each of the pinch plates 2 and 3 and the composition 13 is filled with a conductive material 15, such as a thermoset or thermoplastic conductive adhesive, or solder paste. As the composite film is passed in the direction marked with the arrow, the conductive material is squeezed by means of the pinch plates 2 and 3 simultaneously into both sides of the holes 14 in the composite film 13. The conductive material 15 is supplied to the coating head 1 from a reservoir 16 thereof.

The composite film 13 which emerges from the coating head 1 thus has pillars of the conductive adhesive 15 extending through the holes 14. The composite film is then cured or dried and subsequently delaminated by removal of the layers 11 and 12 of the release material. The angle which the composite film makes with the horizontal as it emerges from the coating head 1, is termed the "pull out" angle, θ, which is shown in FIG. 1. In FIG. 3 the pull off angle is 0 degrees.

The present invention will be further described with reference to the following Examples.

EXAMPLE 1

A 50 mm wide strip of Staystik 482 film (Alpha Metals Inc.) was laminated together with two layers of Sellotape 2241 pressure sensitive PVC film. Seven 15 ×15 (225) hole profiles (0.5 mm holes on 15 mm pitch) were punched through the composite tape. A coating head design as described with reference to FIG. 1 was loaded between the pinch plates (d=0, τ=0) with Staystik 181Z paste (Alpha Metals Inc.). The composite tape was pulled through the pinch plates depositing the thermoplastic conductive adhesive into the array of holes. The paste was dried by heating to 45° C. for 14 hours, and the sacrificial layers of pressure sensitive PVC film were then removed.

The final product contained symmetrical thermoplastic conductive adhesive columns.

EXAMPLE 2

A 50 mm wide strip of Staystik 482 film (Alpha Metals Inc.) was laminated together with two layers of Sellotape 1610 pressure sensitive polyester film. Seven 20×20 (400) hole profiles (0.2 mm holes on 0.5 mm pitch) were punched through the composite tape. A coating head design as described with reference to FIG. 1 was loaded between the pinch plates (d=0, τ=0) with AP800 solder paste (Alpha Metals Inc.). The composite tape was pulled through the pinch plates depositing solder paste into the array of holes. The sacrificial layers of pressure sensitive polyester film were then removed. The paste was dried by heating to 80° C. for 14 hours.

The final product contained symmetrical domed solder paste columns.

We claim:

1. A process for the preparation of an anisotropic conducting material, which process comprises the steps of:
   (i) providing a strip or sheet of a non-conducting matrix and laminating to each side thereof at least one layer of a release material in order to form a composite matrix;
   (ii) forming an array of holes in a predetermined pattern in the composite matrix from step (i);
   (iii) passing the matrix from step (ii) through a coating head which simultaneously fills the holes of the array in the composite matrix from both sides of the said matrix with a conducting material;

(iv) curing or drying the composite filled matrix from step (iii); and (v) removing at least one layer of release material from each side of the matrix.

2. A process as claimed in claim 1 wherein the non-conducting matrix comprises a dielectric adhesive carrier.

3. A process as claimed in claim 1 wherein the non-conducting matrix has a thickness in the range of from 1 to 500 μm.

4. A process as claimed in claim 1 wherein the non-conducting matrix is laminated on each side thereof to a single layer of a release material.

5. A process as claimed in claim 1 wherein the non-conducting matrix is laminated on at least one side thereof to a plurality of layers of a release material.

6. A process as claimed in claim 1 wherein the holes are formed in the composite matrix from step (i) by punching or drilling the holes in a predetermined pattern.

7. A process as claimed in claim 6 wherein a plurality of holes of different diameters are used in forming the pattern.

8. A process as claimed in claim 1 wherein the composite matrix is passed in step (iii) through a coating head which comprises upper and lower pinch plates having a reservoir of a conducting material formed therebetween, the leading edges of the said pinch plates being separated by a distance sufficient to accommodate passage of the composite matrix between the said plates, the conducting material being forced into-the holes formed in the composite matrix simultaneously from both sides of the matrix by the upper and lower pinch plates as the matrix passes through the coating head.

9. A process as claimed in claim 1 wherein the conducting material is selected from the group consisting of a conducting adhesive and a solder paste.

10. A process as claimed in claim 9 wherein the conducting adhesive is selected from the group consisting of a thermoplastic polymer loaded with particles of a conductive material, a thermoplastic polymer loaded with spheres of a conductive material, a thermosetting polymer loaded with particles of a conducting material and a thermosetting material loaded with spheres of a conductive material.

11. A process for the preparation of an anisotropic conducting material, which process comprises the steps of:

(i) providing a strip or sheet of a non-conducting matrix and laminating to each side thereof at least one layer of a release material in order to form a composite matrix, the composite matrix having an array of holes in a predetermined pattern formed therein;

(ii) passing the matrix from step (i) through a coating head which simultaneously fills the holes in the array of the composite matrix from both sides of the said matrix with a conducting material;

(iii) curing or drying the composite filled matrix from step (ii); and (iv) removing at least one layer of release material from each side of the matrix.

* * * * *

UNITED STATES PATENT AND TRADEMARK OFFICE
CERTIFICATE OF CORRECTION

PATENT NO.   : 5,902,438
DATED        : May 11, 1999
INVENTOR(S)  : Arthur et al It is certified that error appears in the above-identified patent and that said Letters Patent is hereby corrected as shown below:

Column 3, line 43, change the word "figures" to "drawings".

Column 3, line 49, change the word "figures" to "drawings".

Column 4, line 30, change the words "15 mm pitch" to "1.5 mm pitch".

Signed and Sealed this

Sixteenth Day of January, 2001

Attest:

Q. TODD DICKINSON

*Attesting Officer*            *Commissioner of Patents and Trademarks*